(12) United States Patent
Grundy et al.

(10) Patent No.: US 10,267,832 B2
(45) Date of Patent: Apr. 23, 2019

(54) NON-CONTACT POWER DETECTION DEVICE

(71) Applicant: AVTECH Software, Inc., Warren, RI (US)

(72) Inventors: Richard Grundy, Warren, RI (US); Robert Snow, Warren, RI (US)

(73) Assignee: AVTECH Software, Inc., Warren, RI (US)

( * ) Notice: Subject to any disclaimer, the term of this patent is extended or adjusted under 35 U.S.C. 154(b) by 105 days.

(21) Appl. No.: 15/471,178

(22) Filed: Mar. 28, 2017

(65) Prior Publication Data

US 2018/0284168 A1    Oct. 4, 2018

(51) Int. Cl.
*G01R 21/08*    (2006.01)
(52) U.S. Cl.
CPC .................................. *G01R 21/08* (2013.01)
(58) Field of Classification Search
CPC ... G01R 1/203; G01R 15/146; G01R 19/0007
See application file for complete search history.

(56) References Cited

U.S. PATENT DOCUMENTS

| 2013/0033260 A1* | 2/2013 | Nomura | G01R 15/207 324/252 |
| 2017/0264385 A1* | 9/2017 | Anderson | H04H 60/04 |

\* cited by examiner

*Primary Examiner* — Tung X Nguyen
(74) *Attorney, Agent, or Firm* — Armis IP Law, LLC

(57) ABSTRACT

A power detection device for a facility monitoring system provides non-contact power detection in a power supply line for determining a powered up or energized state of equipment connected to the power supply line. The power detection device is adapted to be disposed in communication with a live power supply line without disconnecting or interrupting the power supply to the powered equipment. A hinged casing including a sensor circuit for detecting electrical current is frictionally engaged to the power supply line by closing the hinge and drawing opposed sides of the casing together. Sensor signals are aggregated and amplified such that an amplified signal above a threshold is indicative of a current flow sufficient to power the equipment and render a determination of an energized, or "equipment on" state. Conversely, the lack of a threshold signal indicates inactive equipment such that remedial measures may be commenced.

21 Claims, 7 Drawing Sheets

NON-CONTACT POWER DETECTION DEVICE

BACKGROUND

Electrical equipment such as computers, networking devices, and support appliances such as HVAC (Heating, Ventilation and Air Conditioning) equipment is often an integral part of businesses, universities and other enterprises. Modern developments in networking and computing abilities allow remote and continuous access to information systems on which the enterprise relies. Such automation increases the likelihood that computer and network access will be required of an unattended system. Accordingly, facility monitoring systems that can assess the state of various appliances are gaining popularity for identifying operational anomalies that can lead to system downtime.

SUMMARY

A power detection device provides non-contact power detection in a power supply line for determining a powered up or energized state of equipment connected to the power supply line. The power detection device is adapted to be disposed in communication with a live power supply line without disconnecting or interrupting the power supply to the powered equipment. A hinged casing including a sensor circuit for detecting electrical current is frictionally engaged to the power supply line by closing the hinge and drawing opposed sides of the casing together. The sensor circuit includes electrical or magnetic sensors at different distances from opposed conductors in the power supply line. The sensors, such as Hall effect sensors, are responsive to current flow in the power supply line but influenced differently based on the distance from the conductors (typically "hot" and "neutral") such that the sensors receive a net magnetic field. Sensor signals are aggregated and amplified such that an amplified signal above a threshold is indicative of a current flow sufficient to power the equipment and render a determination of an energized, or "equipment on" state. Conversely, the lack of a threshold signal indicates inactive equipment such that remedial measures may be commenced.

Configurations herein are based, in part, on the observation that facility monitoring systems typically expect to include computing equipment in a monitoring repertoire for providing comprehensive coverage. Unfortunately, installing such a monitoring system often requires unplugging or otherwise taking computing equipment out of service for installation of an interface to the facility management system. For a large equipment base with many CPUs/racks/routers, etc., not only is this a formidable task, but may be prohibitive or expensive in terms of system downtime. Conventional approaches suffer from the shortcoming that the monitoring system accesses the conductors (i.e. AC plug) powering the equipment for establishing conductive communication with the power supply. Often, a sensor device interfaces between the AC outlet and equipment plug for directly attaching to both legs of the current supply.

Configurations herein substantially overcome the shortcomings presented by conventional, conductive contact based approaches by providing a non-contact electrical detection sensor adapted for installation onto a live power supply line or cord without disconnecting the power or otherwise taking the equipment out of service. A non-contact electrical detection device has a clamp-around "clamshell" design which engages two halves for closure around a live power cord, and includes a detection circuit and interface to the facility monitoring control.

The non-contact electrical detection device, in a particular configuration, senses a current flow from a magnetic field induced in current carrying conductors in the power cord. Conventional approaches employ current detection mechanisms which require separation of hot and neutral conductors to avoid cancellation effects of opposed current flows, again requiring equipment disconnection. In contrast, in the disclosed approach, Hall effect sensors or other magnetically sensitive elements sense a current flow, and are positioned and amplified to avoid a cancellation effect that tends to occur with opposed electrical flow in a pair of conductors powering a common load.

Conventional approaches also include non-contact voltage detectors, which are ineffective because a voltage source is still sensed when the equipment is powered down, and an active load has a varied effect on the voltage depending on a voltage drop across the equipment. Thus, voltage is not an effective indicator of an equipment powered-on state.

In a particular configuration as disclosed herein, the non-contact power detection device includes at least one electrical sensor adapted to be disposed adjacent to an electrical supply cord, in which the electrical supply cord has a plurality of conductors for powering a load such as computing systems or racks. The electrical sensor is adapted to transmit a signal based on a distance from each electrical conductor of the plurality of electrical conductors, such that the distance is different for each conductor of the plurality of conductors. A conditioning circuit receives the transmitted signal from each electrical sensor, such that the plurality of electrical conductors has an aggregate net effect on each electrical sensor based on the different distances. A comparator determines, based on the comparison of the transmitted signals, an electrical characteristic such as a minimum current flow in the electric supply cord.

The circuit board is enclosed in a casing configured for engaging around the electric supply cord (cord) in close proximity to the electrical sensors. The casing defines a slot, recess, trough or other structure for positioning the electrical supply cord against or adjacent to the electrical sensors. The shape of the power cord (i.e. round or flat) may also be a factor in the recess shape. The use of two or more electrical sensors along a line transverse to the conductor flow mitigates imprecision from spiral or uncentered conductors by ensuring that at least one of the sensors is disposed at different distances from the opposed conductors.

A further feature may include a magnetic field strength indicator such as a series of led lights or needle gauge to indicate an optimal position of the electrical supply cord for ensuring that a subtle current dropoff does not result in a nuisance trip or alarm.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Configurations below depict an example implementation of the current detection device using a form factor suitable for installation on a standard power supply cord for table or rack mounted 110-120 v AC power. The disclosed arrangement includes current detection operation as an indicator of equipment powered-on state in a facility monitoring environment. The facility monitoring environment is particularly amenable to business and information processing locations which are overseen by a system such as the Room Alert® monitoring platform, marketed commercially by AVTECH Software, Inc. of Warren R.I., assignee of the present application. Other suitable configurations and form factors may be employed for the disclosed circuit and detection method.

Figure 1:
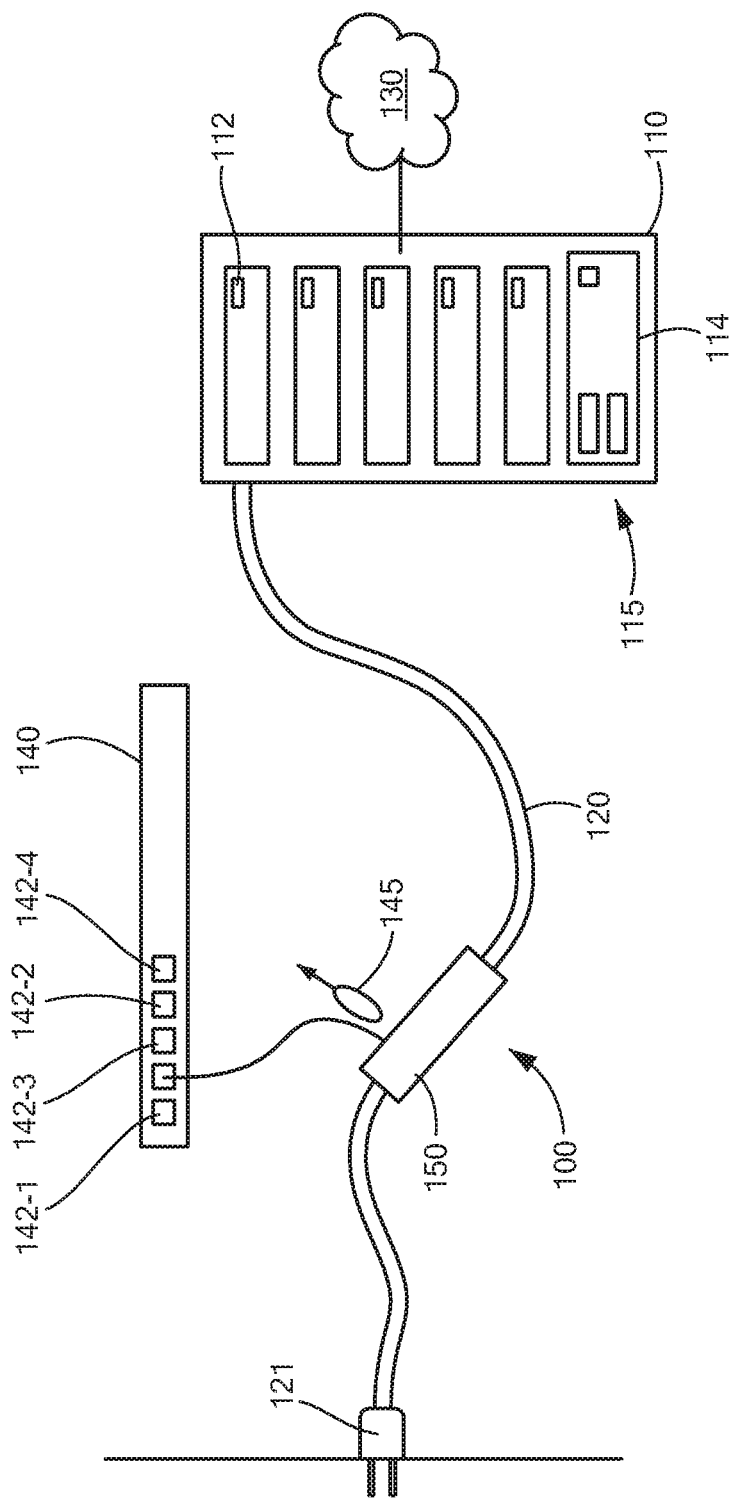
FIG. 1 is a context diagram of an electronic and computer equipment environment suitable for use with the present invention.

FIG. 1 is a context diagram of an electronic and computer equipment environment suitable for use with the present invention. Referring to FIG. 1, in an equipment monitoring environment 100, equipment such as machine racks 110 housing network and computing devices 112 define a load 115 powered (either directly or from an intermediate power supply 114) through an electric supply cord 120. The electric supply cord connects to an outlet 121 that provides standard 110-120 v AC power common to the modern electric grid. The computing devices 112 typically provide computing and information services to a business or enterprise via a local or remote network 130 such as the Internet, LAN (Local Area Network), WAN (Wide Area Network), WiFi via well known IEEE 802.11 wireless connections, or other suitable communication linkage.

In the equipment monitoring environment 100, it is beneficial to monitor various parameters of the environment, such as temperature, door/window activity, entry locks, temperature, humidity, and equipment state, to name several. A monitoring host 140 receives status signals 145 from various detection modules 142-1 . . . 142-4 indicative of the various parameters. In particular, the non-contact power detection device 150 is operable to detect an energized state of the computing devices 112 by detecting an electrical flow in the electric supply cord 120. Alternatively, the non-contact power detection device 150 is configurable in a standalone state for computing and delivering the status signal 145 indicative of a "live," or current carrying conductor in the electrical supply cord 120.

Another feature is shown by temperature monitoring in particular. Detection modules for temperature often accompany electrical flow, as in a machine room environment, electrical power and associated resistance is the major cause of heat. Accordingly, it is beneficial to locate a temperature sensor in a common detection module 142 for tracking heat associated with the detected electrical demand. For example, in the electrical equipment environment, the device could not only detect that power is flowing through the cable, but also the exact temperature at the point of measurement. Since this will often be used in locations where temperature is a concern (i.e. behind a server rack 'hot aisle', in a basement, adjacent to important equipment, etc), the combined power and temperature data are complementary.

Figure 2:
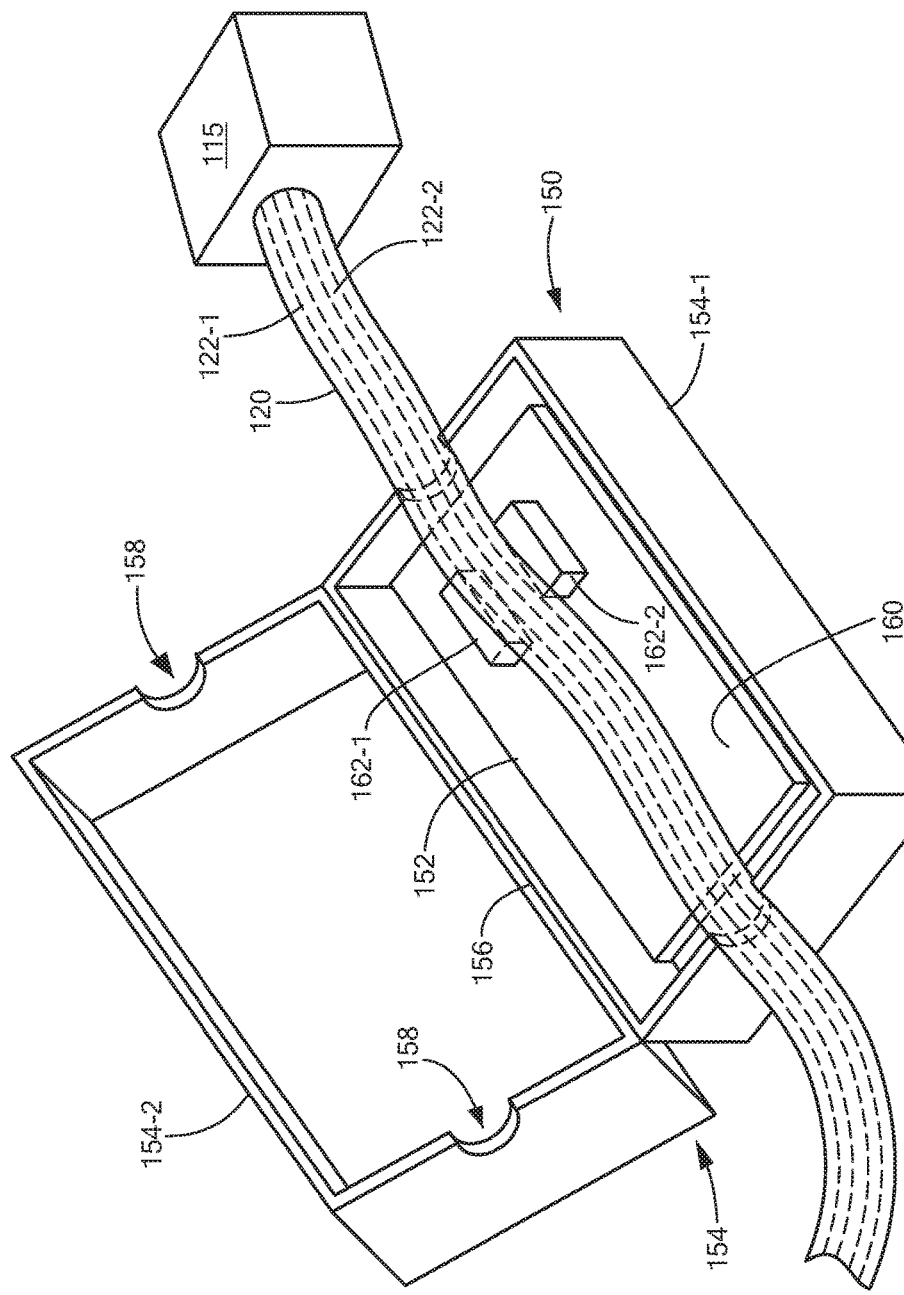
FIG. 2 is a perspective view of the current detection device of FIG. 1 in a partially installed state.

FIG. 2 is a perspective view of the current detection device of FIG. 1 in a partially installed state. Referring to FIGS. 1 and 2, the current detection device 150 includes a circuit board 152 disposed in a casing 154. The casing 154 has a base portion 154-1, onto which the circuit board 152 attaches, and a top portion 154-2, which closes over the base portion 154-1 via a hinge 156 for engaging the cord 120 in a frictional engagement inside the casing 154. The opposed hinged sides 154-1, 154-2 define a cavity containing the power detection device in proximity with the electrical supply cord 120, in which the sides include a gap or recess 158 for engaging the electrical supply cord 120 in a frictional engagement via closure of the hinge for drawing the opposed sides together. The recesses 158 accommodate the cord 120 and provide a close tolerance fit to secure the cord 120 adjacent the circuit board 120. The recesses 158 may be sized to particular diameters or cross sections of the cord 120, or may employ a ratcheting or variable closure to accommodate different sized cords.

In addition to a hinged form factor, alternative engagements and attachments exist for disposing the electrical sensors 162 in proximity to the power cord. Fastening could be accomplished by a single sided device strapped to the cable, or a spring or clamp to hold it to the cable, for example. The casing may also be an over-mold having a similar form function, but defined by a single piece rather than distinct base and top portions.

The example arrangement of FIGS. 2, 3 and 4A-B depicts two electrical sensors 162, each corresponding to a conductor 122. The power detection device 150, adapted for engaging an active electrical supply cord while maintaining a continuous power supply to a load powered by the electrical supply cord, includes a pair of magnetic sensors 162 disposed adjacent to the electrical supply cord 120. The magnetic sensors 162 are aligned with the recess 158 or gap for positioning the electrical supply cord 120 adjacent to the magnetic sensors 162. Each magnetic sensor 162 is disposed proximate to a respective conductor 122-N in the electrical supply cord 120, such that the respective conductors 122-N each have an opposed polarity for powering the load 115. The casing sides 154 further define the recess 158 on opposed sides of the casing, such that the pair of magnetic sensors 162 is disposed on a path defined by the opposed gaps. The magnetic sensors 162 are aligned with the recess 158 or gap for positioning the electrical supply cord 120 adjacent to the magnetic sensors 162. The path aligns the conductors 122 in the electrical supply cord 120 such that each conductor 122 is more proximate to one electrical sensor of the pair of electrical sensors 162. The electrical sensors 162 are configured to sense a net magnetic influence resulting from partial cancellation of magnetic influence from each of the proximate and distal conductors 122.

A conditioning circuit 160, discussed further below in FIG. 5, connects to each of the magnetic sensors 162 and is configured for aggregating a received sensing signal 502-1, 502-2 (502 generally) from each of the magnetic sensors 162, such that the sensing signal 502 is based on a current flow in the respective conductor 122. The respective conductor 122 is proximate to the magnetic sensor 162 for being more influenced by the proximate conductor than a distal conductor having the opposed polarity. In the example arrangement, the respective conductors 122 are defined by a common current flow for powering the load 115, thus the respective conductors 122 have an opposed current flow. A comparator 170 compares the aggregated sensing signals for determining a current flow in the electrical supply cord 120 indicative of the load 115 being in a powered up state.

The circuit board 152 implements the conditioning circuit 160, discussed further below in FIG. 5, and having least one electrical sensor 162 adapted to be disposed adjacent to the electrical supply cord 120, in which the electrical supply cord 120 has a plurality of conductors 122-1 . . . 122-2 (122 generally) for powering the load 115. The example of FIG. 2 depicts two electrical sensors 162-1 . . . 162-2 (162 generally), such as Hall effect sensors, for example.

Figure 3:
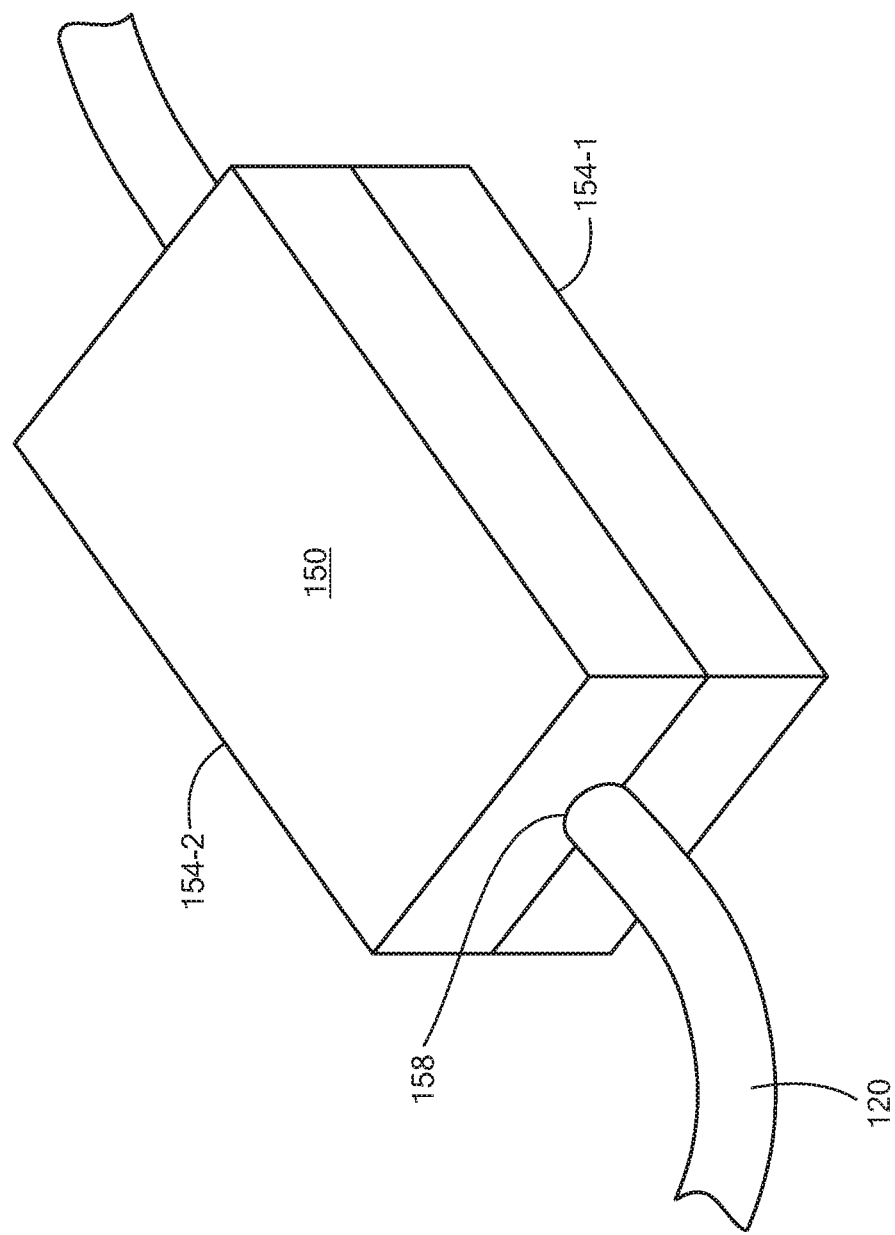
FIG. 3 is perspective view of the current detection device of FIG. 1 in an installed and active state.

FIG. 3 is perspective view of the current detection device of FIG. 1 in an installed and active state. Upon closure of the hinge 156, the case portions 154-1 and 154-2 are engaged together and effect a clamping force on the cord 120 via the recesses 158. This brings the cord 120 and conductors 122 within in close communication with the electrical sensors 162, as now discussed further below.

Figure 4A:
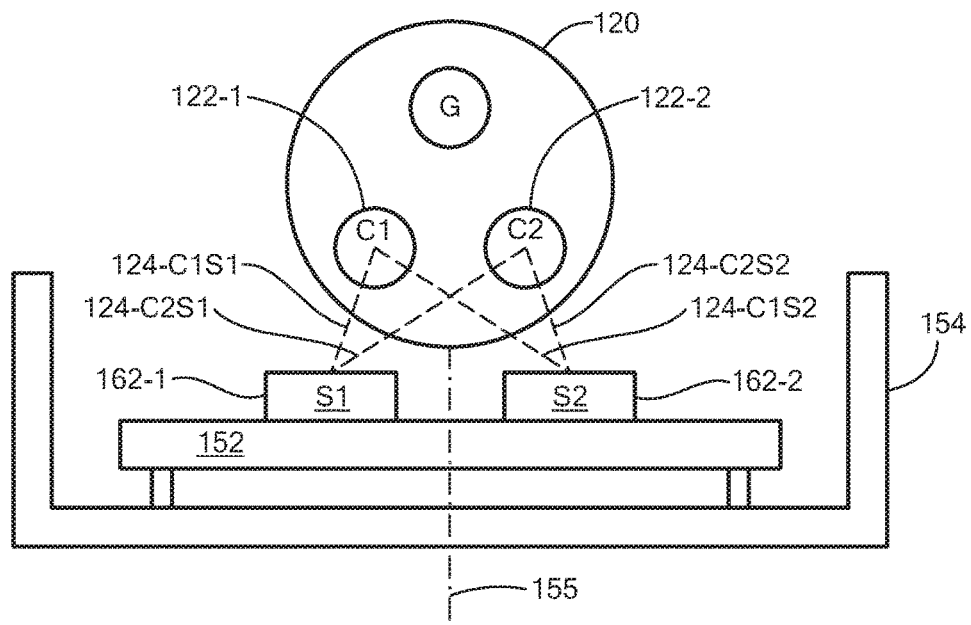
FIGS. 4A and 4B are a cross section view of the current detection device of FIG. 3.
Figure 4B:
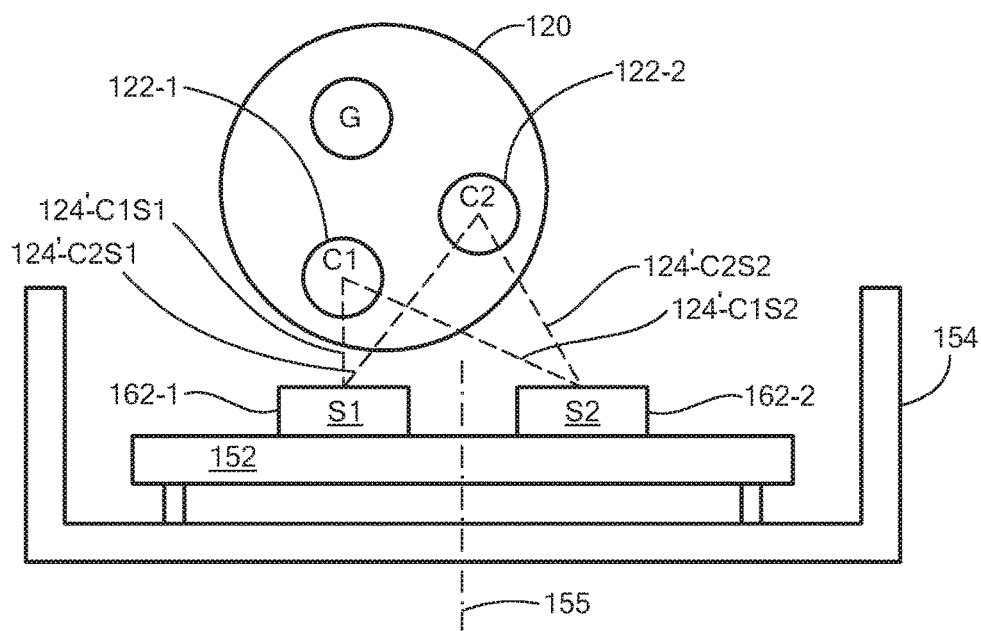

FIGS. 4A and 4B are a cross section view of the current detection device of FIG. 3. Referring to FIGS. 2 and 4A, a cord 120 passing through the casing 154 adjacent or proximate to the circuit board 152 includes the conductors 122-1 and 122-2, corresponding to the hot and neutral poles of a typical 120 v AC circuit, and a ground G, a typical electrical supply for computer equipment. However, detection is expected to operate similarly with 220-240 v or other suitable voltage sufficient for detection by the electrical sensors 162. The electrical sensors 162 are adapted to transmit a signal based on a distance 124 from each electrical conductor 122 of the plurality of electrical conductors, in which the distance 124 is different for each conductor 122-N of the plurality of conductors 122, resulting in a signal differential at each electrical sensor 162. This distance differential avoids cancellation of opposed magnetic fields for generating a net magnetic field and corresponding field at each electrical sensor 162. Based on the position of the cord 120, the conductors 122 are each disposed a respective distance from each sensor 162. In a well defined cord scenario, each electrical sensor 162 is proximate to a corresponding electrical conductor 122 of the plurality of the electrical conductors, such that the corresponding electrical conductor has the greatest influence on an aggregate net effect received by the electrical sensor. In the view of FIG. 4A, conductor C1 is disposed generally above sensor S1 and conductor C2 is disposed generally above sensor S2. Therefore, a distance 124-C1S1 is substantially less than a distance 124-C2S1. Accordingly, the sensor S1 is influenced more by the magnetic field resulting from C1 than from C2. Similarly, the distance 124-C2S2 is less than the distance 124-C1S2, thus sensor S2 is most influenced by the current flow in conductor C2, as the opposed (cancelling) field is from C1 substantially less.

However, the cord 120 may not lie exactly centered in the casing. Factors such as cord size, whether the cord 120 has 2 conductors or a third ground G, insulation thickness and conductor twisting inside the cord insulation affect the location of the actual conductors 122. Also, tolerances in the recesses may affect the alignment of the cord 120 across the electrical sensors 162. Referring to FIG. 4B, the cord 120 lies slightly off-center (dotted line 155), such that C1 is substantially closer to S1 than C2 is to S2. In contrast to a relatively closer positioning to the corresponding sensor and a larger distance to the opposed sensor as in FIG. 4A, the conductor C2 lies substantially centered between S1 and S2. Therefore, the distance 124'-C2S1 and 124'-C2S2 are similar. However, this is offset because the distance 124'-C1S1 is much shorter than the distance 124'-C1S2, so the influence of current flow on S1 is dominated by C1 and is cancelled very little from the opposing influence from C2. In other words, an exacting alignment of the cord 120 between the electrical sensors 162 is not required because a weaker differential exerted by one conductor 122-2 tends to be offset by a stronger differential exerted by the other conductor 122-1.

In the example of FIGS. 4A and 4B, the electrical sensors 162 are responsive to a magnetic field indicative of a current flow in each electrical conductor 122, such that the plurality of electrical conductors 122 has an aggregate net effect on each electrical sensor 162 based on the different distances 124, 124'. The aggregate net effect is based on magnetic cancellation from opposed current flow, in which the electrical sensors 162 are in nonconductive communication with the electrical conductors, such as a Hall effect sensor or other magnetic field sensor.

FIGS. 4A and 4B therefore depict a pair of electrical sensors disposed at proximate and distal locations from opposed electrical conductors 122, such that the opposed electrical conductors 122 correspond to positive and negative polarity of a current flow, and the determined electrical characteristic is a current flow sufficient for powering an equipment load with the electric supply cord. The sufficiency of the current flow is measured by a conditioning circuit and comparator, discussed further below. Alternate configurations may include varying number and arrangements of electrical sensors, and may be configured for sensing additional electrical conductors. For example, the electrical sensors 162 may be axially offset along the power supply cord 120, rather than disposed along a line transverse to the current flow.

Figure 5:
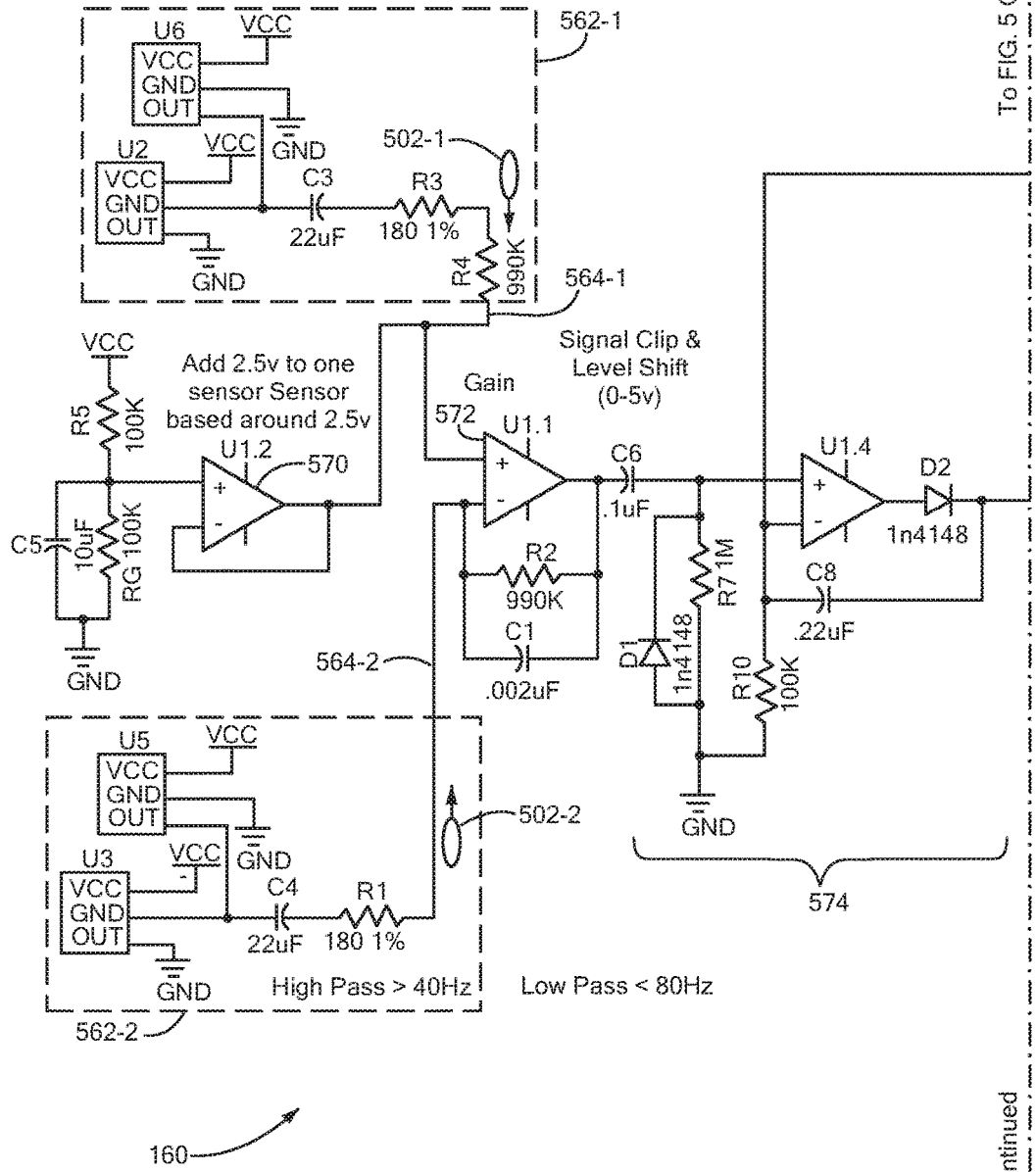
FIG. 5 with FIG. 5 continued is a schematic view of the circuit in the current detection device of FIGS. 1-4.
Figure 5:
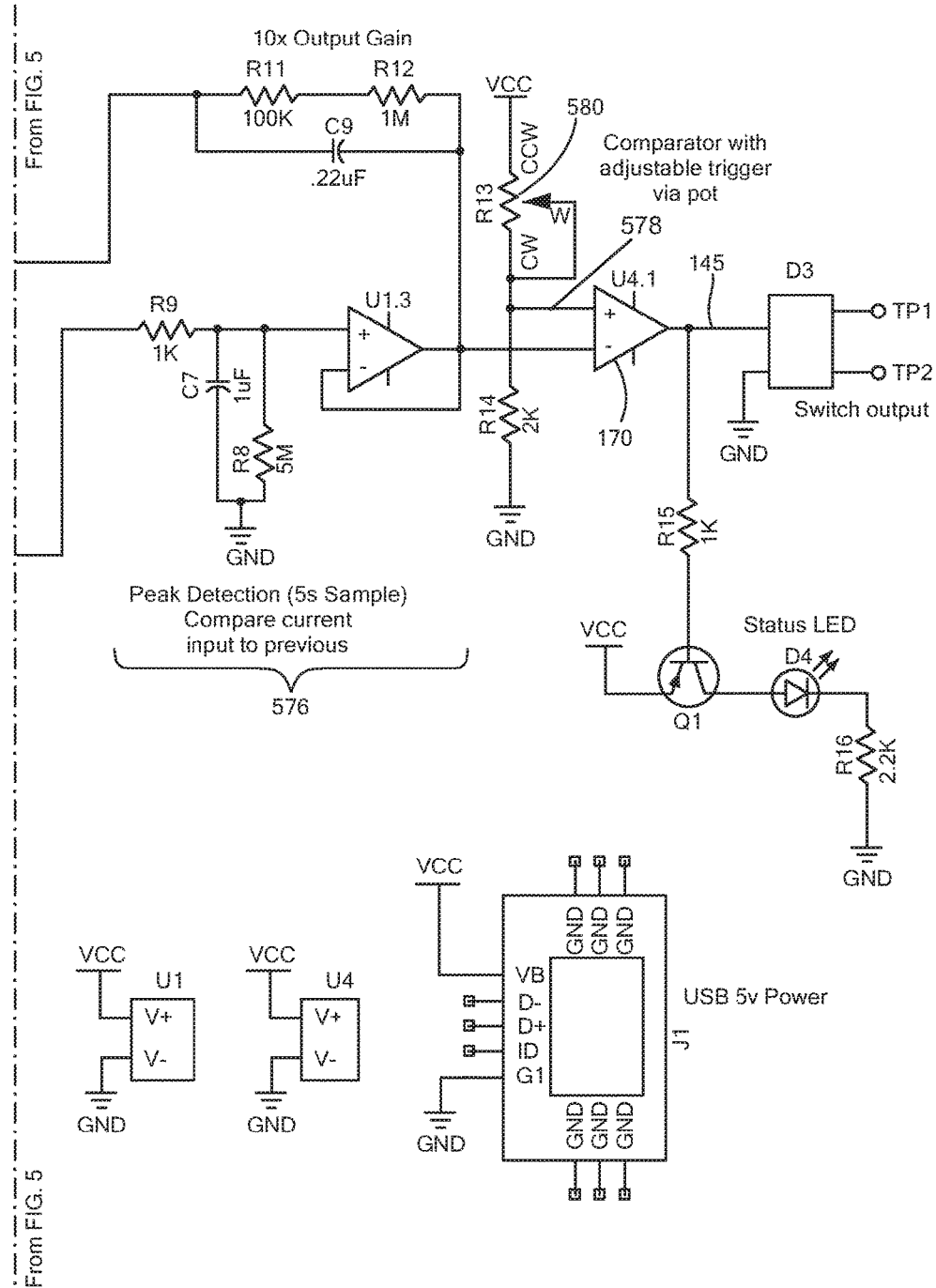

FIG. 5 is a schematic view of the circuit 160 in the current detection device of FIGS. 1-4. Referring to FIGS. 1-5, the non-contact power detection device 150 further includes a conditioning circuit 160 on the circuit board 152 for receiving the transmitted signal from each electrical sensor, and a comparator 170 for determining, based on the comparison of the transmitted signals, an electrical characteristic of the electric supply cord 120. The conditioning circuit 160 receives magnetic field signals from the electrical sensors 162-1 and 162-2, defined as circuit components 562-1 and 562-2. In the example conditioning circuit 160, employing Hall effect sensors as the electric sensors 162, the sensors receive a 5V input signal, and output a respective sensing signal 564-1, 564-2.

The conditioning circuit 160 is configured for combining the transmitted signals by adding the transmitted signals indicative of the aggregate net effect on each electrical sensor 162, and thus combines a magnitude of the received sensing signals from each respective magnetic sensor 162. In the disclosed arrangement, the conditioning circuit 160 effectively preforms this by a subtraction of the received sensing signals from respective sensors of opposed polarity. An amplifier 570 adds 2.5V to the output of one sensor, and both outputs connected to differential gain amplifier 572. This effectively performs the subtraction of one sensor output signal from the other. Since the electrical sensors 162 are based on opposite magnetic fields caused by current flowing in opposite directions on parallel conductors, a subtraction effectively adds the magnitude of both signals such that the resulting magnitude represents the aggregate current of both conductors 122-1 and 122-2.

Since the current flow is defined by an AC signal, the conditioning circuit 160 is configured for level shifting, clipping and peak detection of the aggregated received sensing signals for identifying magnetic field variations indicative of the current flow. A level shifting and clipping circuit portion 574 results in a positive, nonzero signal indicative of an AC current signal. A peak detection portion 576 isolates the greatest magnitude, and the comparator 170 determines when the magnitude is indicative of a conductor current flow indicating a powered on state of the equipment 115.

The comparator 170 uses a threshold input 578, which may be fixed or adjusted via a potentiometer 580. The comparator 170 is coupled to the conditioning circuit 160 and is configured to compare the transmitted signals to a threshold, such that each transmitted signal is based on the aggregation from the corresponding electrical conductors 122. Any suitable threshold may be employed, depending on the wattage of the load 115. A nominal equipment power supply should draw at least 50 watts, substantially more than a stray or leakage current that may be induced from idle equipment. This may be contrasted with a voltage detection approach, where a voltage difference between idle and powered equipment would be difficult to detect. An output signal 145 is generated based on the threshold detection indicating powered-on state resulting from a current level above the threshold.

Other circuit implementations may be installed on a circuit board and/or implanted as a set of instructions in firmware or software for performing the steps for computing and comparing the detected current to a threshold. The method of non-contact detection of current flow includes receiving a first magnetic signal at a first sensor 162-1 indicative of a first electrical signal in a first conductor 122-1, and receiving a second magnetic signal at a second sensor 162-2 indicative of a second electrical signal in a second conductor 122-2. The first conductor 122-1 and second conductor 122-2 power a common load 115 such as a computing rack or equipment, in which the first sensor 162-1 is adjacent the first conductor 122-1 and the second sensor 162-2 is adjacent the second conductor 122-2. Conditioning logic combines the first magnetic signal and the second magnetic signal for computing a strength signal indicative of an electrical characteristic of the common load 115. The first and second magnetic signals are based on a current flow in the adjacent conductor 122 and a distance from the adjacent conductor and the electrical characteristic is the current flow for powering the common load 115. The sensors 162 are in nonconductive communication with the electrical conductors 122, such as Hall effect sensors. In operation, the first sensor 162-1 receives a magnetic influence from the first conductor 122-1 mitigated by an opposed magnetic influence from the second conductor 122-2, and the second sensor 162-2 receives a magnetic influence from the second conductor 122-2 mitigated by an opposed magnetic influence from the first conductor 122-1, in which the mitigation is based on a difference in the distance 146 of the sensor 162 from the first conductor 122-1 and the second conductor 122-2.

Figure 6A:
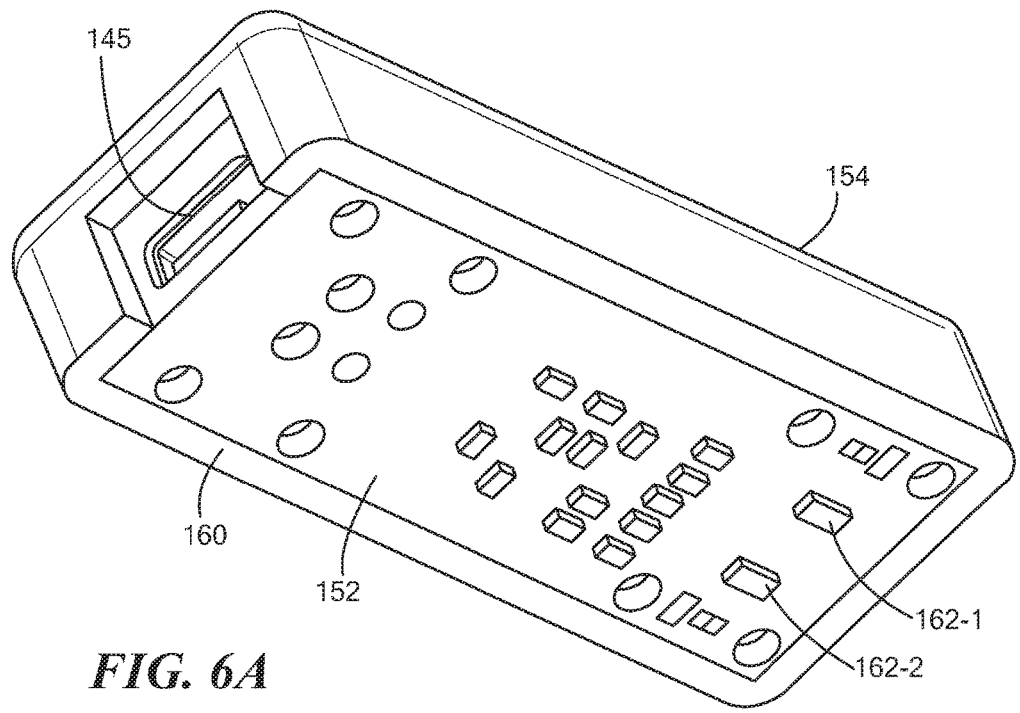
FIG. 6A is a perspective view of a cord engaging side of a particular form factor of the circuit of FIG. 5.
Figure 6B:
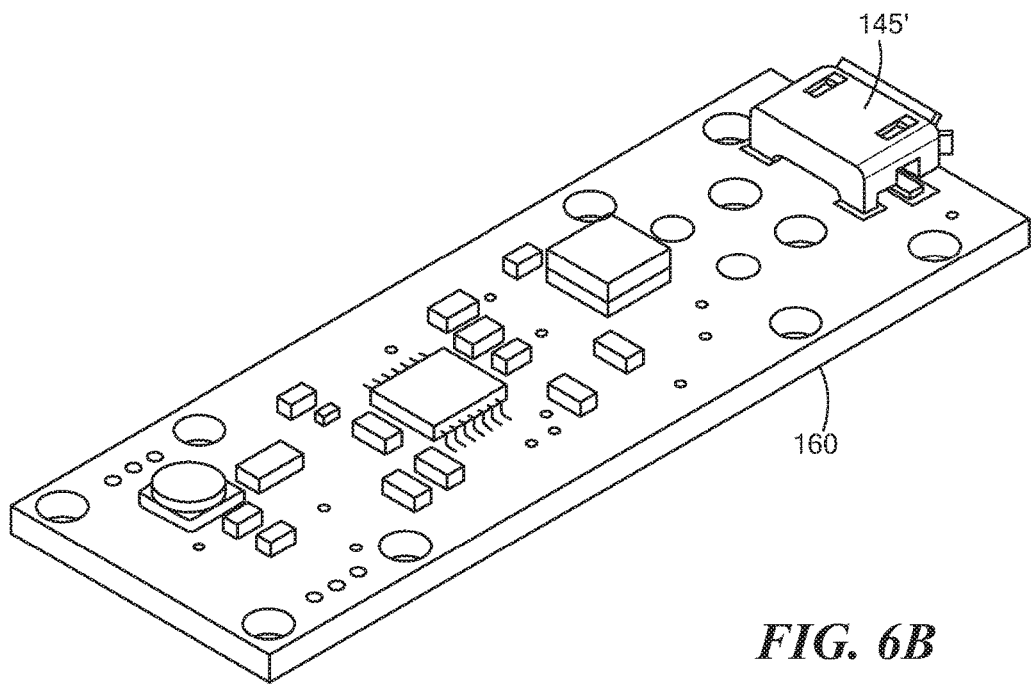
FIG. 6B is a perspective view of an opposed side of a circuit board implementing the circuit of FIGS. 5 and 6A.

FIG. 6A is a perspective view of a cord engaging side of a particular form factor of the circuit of FIG. 5, and FIG. 6B is a perspective view of an opposed side of a circuit board implementing the circuit of FIGS. 5 and 6A. Referring to FIGS. 6A and 6B, the casing 154 houses the circuit board 152 including the conditioning circuit 160, the comparator 170 and the electrical sensors 162-1, 162-2. An interface 145' receives a connection for the output signal 145. Installation may be aided by a strength level indicator indicative of the sensed magnetic field strength as the casing 154 is clamped or secured around the cord 120, such as a series of LED lights to indicate a strong differential indicating current flow detection.

Those skilled in the art should readily appreciate that electronic logic and instructions as disclosed herein are open to implementation in many forms, including but not limited to a) information permanently stored on non-writeable storage media such as ROM devices, b) information alterably stored on writeable non-transitory storage media such as floppy disks, magnetic tapes, CDs, RAM devices, and other magnetic and optical media, or c) information conveyed to a computer through communication media, as in an electronic network such as the Internet or telephone modem lines. The operations and methods may be implemented in a software executable object or as a set of encoded instructions for execution by a processor responsive to the instructions. Alternatively, the operations and methods disclosed herein may be embodied in whole or in part using hardware components, such as Application Specific Integrated Circuits (ASICs), Field Programmable Gate Arrays (FPGAs), state machines, controllers or other hardware components or devices, or a combination of hardware, software, and firmware components.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A non-contact power detection device comprising:
at least one electrical sensor adapted to be disposed adjacent to an electrical supply cord, the electrical supply cord having a plurality of conductors for powering a load;
the electrical sensor adapted to transmit a signal based on a distance from each electrical conductor of the plurality of electrical conductors, the distance being different for each conductor of the plurality of conductors;
a conditioning circuit for receiving the transmitted signal from each electrical sensor, the plurality of electrical conductors having an aggregate net effect on each electrical sensor based on the different distances; and
a comparator for determining, based on the comparison of the transmitted signals, an electrical characteristic of the electric supply cord.

2. The device of claim 1 wherein the electrical sensors are responsive to a magnetic field indicative of a current flow in each electrical conductor, the aggregate net effect based on magnetic cancellation from opposed current flow, the electrical sensors in communication with the electrical conductors.

3. The device of claim 1 wherein each electrical sensor is proximate to a corresponding electrical conductor of the plurality of the electrical conductors, the corresponding electrical conductor having the greatest influence on the aggregate net effect received by the electrical sensor.

4. The device of claim 3 wherein the comparator is coupled to the conditioning circuit and configured to compare the transmitted signals to a threshold, each transmitted signal based on the corresponding electrical conductor.

5. The device of claim 1 wherein the conditioning circuit is configured for combining the transmitted signals by adding the transmitted signals indicative of the aggregate net effect on each electrical sensor.

6. The device of claim 1 further comprising a pair of electrical sensors disposed at proximate and distal locations from opposed electrical conductors, the opposed electrical conductors corresponding to positive and negative polarity of a current flow and the determined electrical characteristic is a current flow sufficient for powering an equipment load with the electric supply cord.

7. A power detection device adapted for engaging an active electrical supply cord while maintaining a continuous power supply to a load powered by the electrical supply cord, comprising:
- a pair of magnetic sensors disposed adjacent to the electrical supply cord, each magnetic sensor disposed proximate to a respective conductor in the electrical supply cord, the respective conductors having an opposed polarity for powering the load;
- a conditioning circuit connected to each of the magnetic sensors and configured for aggregating a received sensing signal from each of the magnetic sensors, the sensing signal based on a current flow in the respective conductor, the respective conductor proximate to the magnetic sensor for being more influenced by the proximate conductor than a distal conductor having the opposed polarity; and
- a comparator for comparing the aggregated sensing signals for determining a current flow in the electrical supply cord indicative of the load being in a powered up state.

8. The device of claim 7 wherein the magnetic sensors are configured to sense a net magnetic influence resulting from partial cancellation of magnetic influence from each of the proximate and distal conductors.

9. The device of claim 8 wherein the respective conductors are defined by a common current flow for powering the load, the respective conductors having an opposed current flow.

10. The device of claim 8 wherein the conditioning circuit is configured for combining a magnitude of the received sensing signals from each respective magnetic sensor.

11. The device of claim 10 wherein the conditioning circuit is configured to perform a subtraction of the received sensing signals from respective sensors of opposed polarity.

12. The device of claim 8 wherein the current flow is defined by an AC signal and the conditioning circuit is configured for level shifting, clipping and peak detection of the aggregated received sensing signals for identifying magnetic field variations indicative of the current flow.

13. The device of claim 7 further comprising a casing having opposed hinged sides defining a cavity containing the power detection device in proximity with the electrical supply cord, the sides including a gap for engaging the electrical supply cord in a frictional engagement via closure of the hinge for drawing the opposed sides together.

14. The device of claim 13 wherein the magnetic sensors are aligned with the gap for positioning the electrical supply cord adjacent to the magnetic sensors.

15. The device of claim 14 further comprising a gap on opposed sides of the casing, the pair of magnetic sensors disposed on a path defined by the opposed gaps, the path aligning the conductors in the electrical supply cord such that each conductor is more proximate to one electrical sensor of the pair of electrical sensors.

16. The device of claim 7 further comprising a temperature sensor in conjunction with the pair of electrical sensors for measuring a temperature associated with the current flow, the measured temperature transmitted for analysis in response to the determined current flow.

17. A method of non-contact detection of current flow, comprising:
- receiving a first magnetic signal at a first sensor indicative of a first electrical signal in a first conductor;
- receiving a second magnetic signal at a second sensor indicative of a second electrical signal in a second conductor,
  - the first conductor and second conductor powering a common load, the first sensor adjacent the first conductor and the second sensor adjacent the second conductor; and
  - combining the first magnetic signal and the second magnetic signal for computing a strength signal indicative of an electrical characteristic of the common load.

18. The method of claim 17 wherein the first and second magnetic signals are based on a current flow in the adjacent conductor and a distance from the adjacent conductor and the electrical characteristic is the current flow for powering the common load.

19. The method of claim 18 wherein the sensors are in communication with the electrical conductors.

20. The method of claim 17 wherein the first sensor receives a magnetic influence from the first conductor mitigated by an opposed magnetic influence from the second conductor, and the second sensor receives a magnetic influence from the second conductor mitigated by an opposed magnetic influence from the first conductor, the mitigation based on a difference in the distance from the first conductor and the second conductor.

21. The method of claim 20 wherein the first and second sensors are Hall effect sensors and the conductors carry an AC current flow, the AC current flow powering a computing load at a substantially consistent amperage load.

* * * * *